United States Patent

Kawada et al.

[11] Patent Number: 5,158,619
[45] Date of Patent: Oct. 27, 1992

[54] PHOTOCONDUCTIVE DEVICE COMPRISING POLYIMIDE FILM

[75] Inventors: Haruki Kawada, Yokohama; Yoshihiro Yanagisawa, Atsugi; Yuko Morikawa, Kawasaki; Suomi Kurihara, Atsugi; Hiroshi Matsuda, Isehara; Hideyuki Kawagishi, Ayase; Kiyoshi Takimoto, Kawasaki, all of Japan

[73] Assignee: Canon Kabushiki Kaisha, Tokyo, Japan

[21] Appl. No.: 682,371

[22] Filed: Apr. 9, 1991

[30] Foreign Application Priority Data

Apr. 10, 1990 [JP] Japan ................................. 2-093234
Apr. 11, 1990 [JP] Japan ................................. 2-094086
Apr. 11, 1990 [JP] Japan ................................. 2-094087
Feb. 26, 1991 [JP] Japan ................................. 3-053255

[51] Int. Cl.$^5$ ........................................ H01L 31/0344
[52] U.S. Cl. .................................. 136/263; 250/211 J; 250/212; 357/8
[58] Field of Search ................ 528/322, 353; 136/263; 357/8; 250/211 J, 212

[56] References Cited

U.S. PATENT DOCUMENTS 4,060,426 11/1977 Zinchuk ............................. 136/263
4,127,738 11/1978 Ghosh et al. ....................... 136/255

OTHER PUBLICATIONS

*European Polymer Journal*, vol. 18, No. 11, 1982, pp. 945-948.
*Chemical Abstracts*, vol. 99, No. 16, Oct. 17, 1983, Abst. No. 123051u (p. 8).

Primary Examiner—Aaron Weisstuch
Attorney, Agent, or Firm—Fitzpatrick, Cella, Harper & Scinto

[57] ABSTRACT

A photoconductive device employs an organic film between a pair of electrodes where the organic film is a polymer having a carbazole skeleton and an imide linkage in a repeating unit of the general formula:

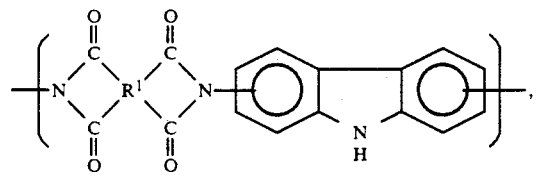

where $R^1$ denotes a tetravalent organic group having 5 to 13 carbons.

8 Claims, 2 Drawing Sheets

PHOTOCONDUCTIVE DEVICE COMPRISING POLYIMIDE FILM

BACKGROUND OF THE INVENTION

1. Field of the Invention

The present invention relates to a photoconductive polyimide, an organic film comprising the polyimide, and a photoconductive device comprising the organic film, which are useful for a photoelectro-transducing device such as a solar cell or a photosensor.

2. Related Background Art

Photoelectro-transducing devices for converting light energy directly to electric energy are used for solar cells and photosensors, so that the development of a photoelectro-transducing material is significant for utilization of solar energy and development of light receiving devices in optoelectronics.

Solid state photoelectro-transducing devices which have been practicalized hitherto employ an inorganic semiconductor such as a single crystal or amorphous silicon. In contrast thereto, photoelectro-transducing devices employing an organic material, which are still in a research stage, are attractive because such devices have the general characteristics of organic materials such as light weight, ease of production, mass-productivity, and inexpensiveness, and are desired for development of organic solar cells and photosensors.

Known organic photoelectro-transducing materials include dyes such as chlorophyll, squarylium, phthalocyanine, merocyanine, etc.; and semiconductive polymers such as poly(N-vinylcarbazole), poly[4-(N,N-diphenylamino)-phenylmethyl methacrylate], etc. which are electrochemically doped, and the like. Organic thin films of these materials are being employed for development of novel photoelectro-transducing devices.

In making a practical device using an organic thin film, a high photoelectro-transducing efficiency is naturally a prerequisite, and additionally, heat stability of the device and workability of the material into a desired shape of the device are extremely important.

For the heat stability, the heat-resistance temperature should be at least 200° C., preferably 300° C. or higher, and a still higher heat-resistance temperature is even more preferable.

The heat resistance relates closely to the melting point, the decomposition temperature, or the glass transition temperature (Tg) of the material. These temperatures will determine the heat-resistance temperature. For example, merocyanine pigments, which are low molecular photoconductive organic materials, have a heat-resistance temperature of approximately 160° C. at the highest, and poly(N-vinylcarbazole) compounds, which are semiconductive polymers, have heat resistance temperatures of around 150° C., depending on the molecular weight. Polymethyl methacrylate, a general-purpose plastic material, has a glass transition temperature of approximately 100° C.; polyvinyl chloride, approximately 70° C.; and polystyrene, approximately 100° C.

On the other hand, phthalocyanines have superior heat stability, and some of them have a decomposition temperature of 200° C. or higher. However, the phthalocyanines are significantly inferior in workability, and will not readily form flat, uniform thin films, which strictly limits application of the phthalocyanines.

Accordingly, by use of an ordinary organic low molecular compound or an organic polymeric compound, it is difficult to attain a melting point, decomposition temperature, or Tg of 300° C. or higher of the material for raising the heat resistance temperature without impairing the workability of the thin film.

Therefore, in developing a photoelectro-transducing device employing an organic thin film, improvement of environmental stability such as heat resistance, and thin-film workability are important in addition to the photoelectro-transducing efficiency. Nevertheless, an organic photoelectro-conductive device which has excellent electroconductive characteristics previously could not be obtained because of the above-mentioned technical difficulties.

In technical fields other than photoelectro-transducing, various heat-resistant resins are known, among which polyimide resins have excellent heat resistance. The polyimide resins are commercialized only for uses requiring heat resistance, wear resistance, chemical resistance, etc. because of the properties thereof, and the use of a polyimide for photoconductive material is still in a research stage. Polyimides having a porphyrin skeleton are also being investigated, which have heat resistance temperature of approximately 200° C., which is still not sufficient heat resistance.

SUMMARY OF THE INVENTION

An object of the present invention is to provide a novel photoconductive polyimide compound which is satisfactory in heat resistance and workability in view of the aforementioned problems of the organic photoconductive compounds of the prior art.

Another object of the present invention is to provide an organic film comprising the polyimide having the aforementioned novel structure to produce a photoelectric device having a novel constitution superior in environmental stability and thin-film workability compared to the conventional photoelectric devices based on the organic films of the prior art.

A further object of the present invention is to provide a photoconductive device comprising the organic film mentioned above.

According to an aspect of the present invention, there is provided a polyimide having a carbazole skeleton in the repeating unit thereof.

According to another aspect of the present invention, there is provided a process for producing a polyimide having a carbazole skeleton in the repeating unit thereof, comprising a dehydrocyclization of the polyamic acid having the repeating unit of the general formula below to cause ring closure:

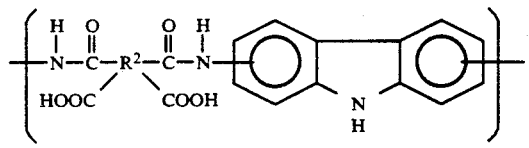

where $R^2$ is a tetravalent organic radical of 5 to 13 carbons.

According to a further aspect of the present invention, there is provided an organic film comprising a polymer having a carbazole skeleton and an imide linkage in the repeating unit thereof.

According to a still further aspect of the present invention, there is provided a photoconductive device comprising an organic film comprising a polymer having a carbazole skeleton and an imide linkage in the repeating unit thereof.

DESCRIPTION OF THE PREFERRED EMBODIMENT

Figure 1A:
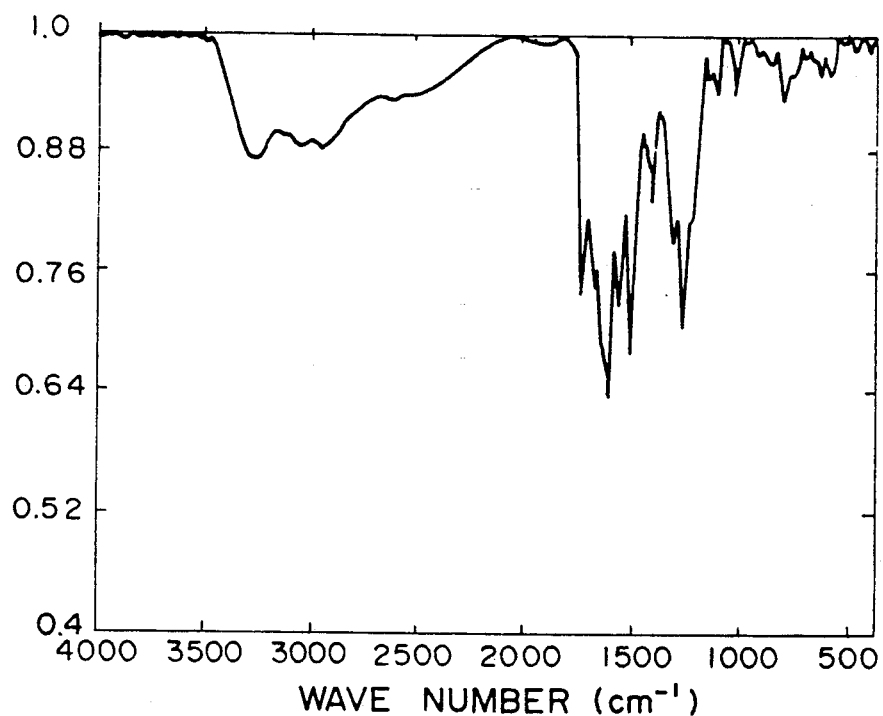
FIG. 1A and FIG. 1B show the infrared absorption spectra for identifying the polyimide having a carbazole skeleton derived in Example 1, wherein FIG. 1A indicates the spectrum of the polyamic acid before imidation, and FIG. 1B indicates the spectrum after the imidation.

The inventors of the present invention, as the result of comprehensive investigation to introduce a photoconductive organic moiety into a polymer to achieve satisfactory heat resistance and environmental stability, have found that a combination of an imide linkage and a carbazole unit gives a superior organic photoconductive polymer.

The present invention provides a polyimide type compound (hereinafter referred to as "the polyimide") which comprises a polymer having a carbazole skeleton and an imide linkage in the repeating unit, and which has electroconductivity. With this compound, a device can be provided which has superior environmental stability.

The carbazole skeleton may form a complex such as a charge-transfer complex with an electron-accepting organic compound, or may have a substitutent such as an alkyl group. At least one imide linkage should be present in the repeating unit. Preferably the polyimide is a polymer having the repeating unit represented by the general formula (I) below:

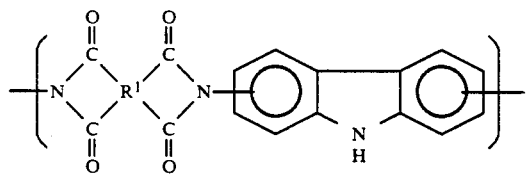

wherein $R^1$ is a tetravalent organic group having 5 to 13 carbons.

The repeating unit may be other than that represented by the general formula (1), including polyamideimides, polyimides, and the like having an amide linkage, an ether linkage, thioether linkage, and etc. which have a carbazole moiety introduced therein.

The group $R^1$ in the general formula (1) is a tetravelent organic group having 5 to 13 carbons, including those having aromatic rings such as

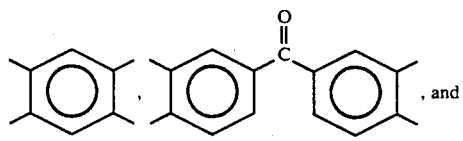

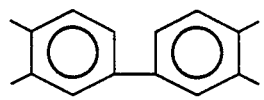

and the like, cyclic hydrocarbon groups such as

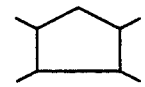

acyclic hydrocarbon groups such as hexamethylenediamine, among which cyclic hydrocarbons are preferable. If the polyimide is constituted of a compound with carbon number outside the range specified above, the heat resistance will be somewhat impaired. A group having an aromatic ring is more preferable for improvement of the heat resistance. Particularly preferable are the groups below:

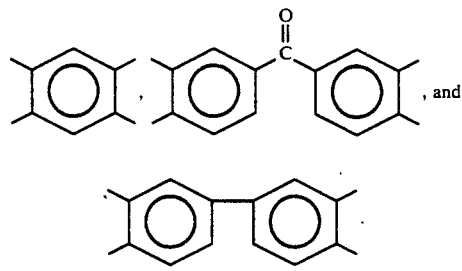

The polyimides constituted of the repeating units of such a structure have a decomposition temperature exceeding 300° C., thereby exhibiting superior heat resistance.

As described above, the polyimides containing an imide linkage in the repeating unit are superior in environmental resistance such as heat resistance, solvent resistance, and the like. The stability is ascribable to the skeletal structure of the polyimide which restricts the degree of freedom of the molecular chain movement to raise the melting point, thereby giving high heat resistance. Since carbazole is a fused ring type hydrocarbon, its structure is planar, so that the degree of freedom of movement of the molecules of the polyimide is not increased by introduction of the carbazole ring, and is kept at the same level as of ordinary polyimides. Therefore the introduction of carbazole rings into the main chain of the polyimide does not impair the heat resistance of the polyimide. Additionally, the introduction of a carbazole ring does not impair the superior environmental stability of common polyimides, such as solvent resistance. The polyimide containing the carbazole skeleton exhibits characteristics of both a polyimide compound and a carbazole skeleton.

The above-described polyimide of the present invention having a carbazole skeleton in the repeating unit is obtainable in principle by dehydrating a polyamic acid or a polyamic acid derivative to cause ring closure. In a typical example, diaminocarbazole as a starting material is reacted with a tetracarboxylic anhydride such as pyromellitic anhydride to cause polyaddition to form a polyamic acid as a precursor of the polyimide, and the polyamic acid is treated chemically or by heating to form the polyimide having the repeating unit represented by the general formula (1).

Alternately, the derived polyamic acid is mixed with an organic compound having an amino group such as N,N-dimethylhexadecyl amine to form a polyamic acid salt, which is then treated in the same manner as in imidation of the polyamic acid to form the polyimide having the repeating unit of the general formula (1).

In still another method, diaminocarbazole is reacted with dialkyl tetracarboxylate such as pyromellitic acid distearyl ester dichloride to cause polyaddition to form a polyamic ester, which is converted to the polyimide in the same manner as above.

The polyaddition reaction can be conducted by a known method. In the case where the group $R^1$ is not a tetravalent organic group, the polyimide having an imide linkage in the repeating unit can be formed by polymerization reaction with diaminocarbazole.

In forming a thin film from the above-described polyimide on a substrate, a solution of a polyamic acid which is the precursor of the above-mentioned polyimide is applied on the substrate, and dried, and then subjected to imidation treatment to form a thin film of the polyimide. The polyamic acid solution may be applied on a substrate by any procedure, insofar as a thin film can be formed, including spin coating, spreading, the Langmuir-Blodgett method, and the like. Among the procedures, the Langmuir-Blodgett method (or simply the LB method), which builds up a monomolecular layer one by one, is particularly preferably in view of controllability of the thickness and the smoothness of the film.

The film thickness is selected depending on the use of the film, generally in the range of from several tens to several ten-thousands of angstroms.

In the imidation by heat treatment, the reaction is conducted at a temperature of from 150° C. to 300° C. for a predetermined time. The imidation by chemical treatment is conducted by drying the applied coating film and subsequently immersing it in a solution which can dehydrate the film-constituting material to cause ring closure. The imidation method is not limited to these methods, but can be any known technique. In other words, in order to form a thin film of a polyimide having the repeating unit of the general formula (1), a solution of a polyamic acid having the repeating unit represented by the general formula

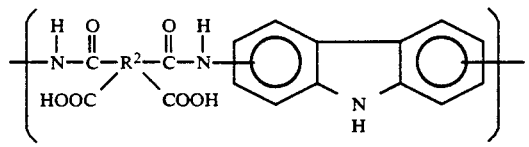

where $R^2$ is a tetravalent organic group having 5 to 13 carbons is applied on a substrate and dried, and is imidated. The group $R^2$ herein corresponds to the aforementioned group $R^1$.

From the thin film of the polyimide having a carbazole skeleton prepared as above, an element can be prepared which has superior environmental stability such as heat resistance and solvent resistance.

In a preferred embodiment, the heat stability exceeds 300° C. The thin polyimide film is expected to exhibit a photoelectro-transducing efficiency at the same level that of a polyvinylcarbazole, and its thin film workability is satisfactory.

For forming a pn junction or a pin junction by employing the aforementioned film, a film doped with iodine or the like and the same film dopant free are built up into a laminated structure.

The materials for the substrate useful in the present invention include light-transmissive substances such as glass, quartz, and the like, The electrodes, which are means for applying a voltage or means for outputting the generated electric current, may be of various types, including one pair of an upper electrode and a lower electrode sandwiching the aforementioned film therebetween, or the like. The type of electrode may be suitably selected depending on the use and the shape of the element. The lower electrode may be a vapor-deposited aluminum film of from 30 to 300 nm thick, or the like. The upper electrode may be a vapor-deposited film of ITO or aluminum of 30 nm thick or less, or the like. The electrode may be in a shape of layers, stripes, or dots. The substrate and the electrodes may be prepared by a conventional method for the element of the present invention.

The present invention is described in more detail by reference to examples.

EXAMPLE 1

(Synthesis of a polyamic acid by polyaddition of diaminocarbazole with pyromellitic anhydride, and imidation by heating)

0.546 (0.0028 mol) of 3,6-diaminocarbazole was placed in a 50 ml three-necked flask. Thereto, approximately 2 ml of dried dimethylacetamide (DMAC) was added. The interior of the flask was kept dry by flowing dry nitrogen, and the content was stirred. Subsequently, 0.666 g (0.0031 mol) of solid pyromellitic anhydride was added into the flask, whereby the temperature in the flask rose slightly. Further thereto, DMAC was added in the total amount of DMAC of 10 ml. The content of the flask was stirred for one hour at room temperature to prepare a solution of a polyamic acid having a carbazole skeleton in dimethylacetamide. The intrinsic viscosity of the product was 0.5. The DSC thermal analysis of the polymer deposited from the solution showed an endothermal peak of imidation at 130° C., and an exothermal peak of heat decomposition at above 340° C. This solution was applied on a silicon substrate by spin coating, and the solvent was evaporated off. The resulting film was heated at 300° C. for one hour to cause imidation. The film thickness was controlled to be 0.5 μm.

Figure 1B:
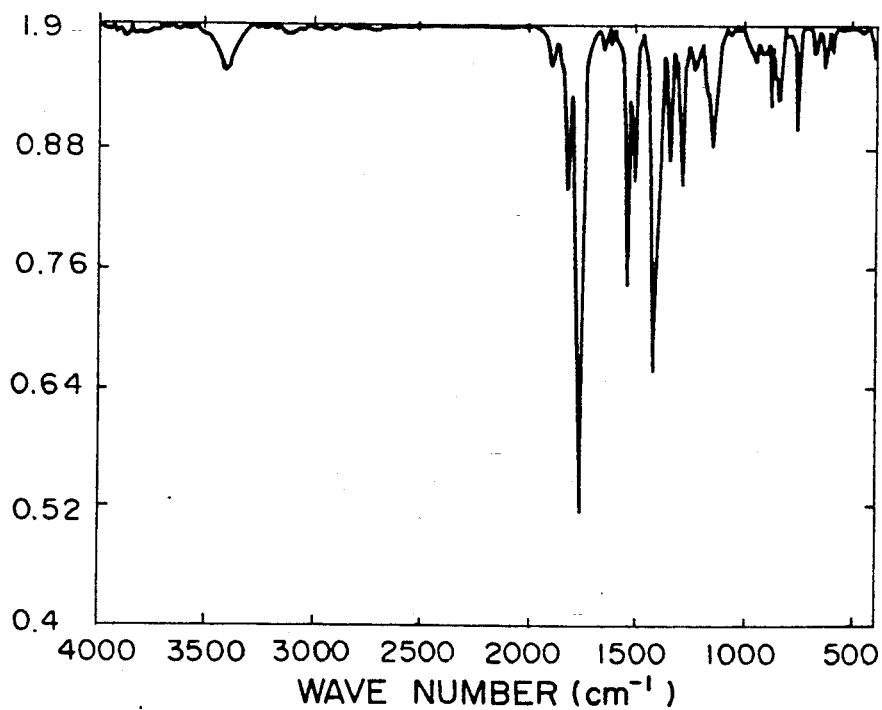

FIG. 1A shows the infrared spectrum of the polyamic acid before imidation, and FIG. 1B shows the spectrum after the imidation by heat treatment. The absorption peak of 1720 cm$^{-1}$ is assigned to the imide ring of pyromellitic acid, and the absorption peaks of 1490 cm$^{-1}$ and 3400 cm$^{-1}$ are assigned to carbazole.

EXAMPLE 2

(Synthesis of polyamic acid by polyaddition of diaminocarbazole with pyromellitic anhydride, and imidation by chemical treatment)

0.546 g (0.0028 mol) of 3,6-diminocarbazole was placed in a 50 ml three-necked flask. Thereto, approximately 2 ml of dried dimethylacetamide (DMAC) was added. The interior of the flask was kept dry by flowing dry nitrogen, and the content was stirred. Subsequently, 0.666 g (0.0031 mol) of solid pyromellitic anhydride was added into the flask, whereby the temperature in the flask rose slightly. Further thereto, DMAC was added in the total amount of DMAC of 10 ml. The content of the flask was stirred for one hour at room temperature to prepare a solution of a polyamic acid having a carbazole skeleton in dimethylacetemide. The intrinsic viscosity of the product was 0.5. This solution was applied on a silicon substrate by spin coating. After evaporation of the solvent, the film on the substrate was immersed into a mixed solution consisting of benzene, pyridine, and acetic anhydride at a mixing ratio of 3:1:1 for 24 hours to cause imidation. The imidation proceeded similarly as in Example 1. The film thickness was controlled to be at 0.5 μm. The thermal property was the same as in Example 1.

EXAMPLES 3 TO 8

The polyimides were prepared in the same manner as in Example 1 except that the imidation conditions and the tetracarboxylic anhydride employed were as shown in Table 1. The results are shown in Table 1. The polyimides all exhibited high decomposition temperature and superior heat resistance.

TABLE 1

| Example | Acid anhydride | Intrinsic viscosity | Imidation conditions | Decomposition temperature |
| --- | --- | --- | --- | --- |
| 3 | Biphenyltetracarboxylic anhydride | 0.6 | Heating at 300° C. for 1 hour | 420° C. |
| 4 | Biphenyltetracarboxylic anhydride | 0.6 | Immersion in mixed solvent of benzene/pyridine/acetic anhydride (3:1:1) for 24 hours | 420° C. |
| 5 | Benzophenonetetracarboxylic anhydride | 0.5 | Heating at 300° C. for 1 hour | 380° C. |
| 6 | Benzophenonetetracarboxylic anhydride | 0.5 | Immersion in mixed solvent of benzene/pyridine/acetic anhydride (3:1:1) for 24 hours | 380° C. |
| 7 | Cyclopentanetetracarboxylic anhydride | 0.2 | Heating at 300° C. for 1 hour | 340° C. |
| 8 | Cyclopentanetetracarboxylic anhydride | 0.2 | Immersion in mixed solvent of benzene/pyridine/acetic anhydride (3:1:1) for 24 hrs | 340° C. |

EXAMPLE 9

Figure 2:
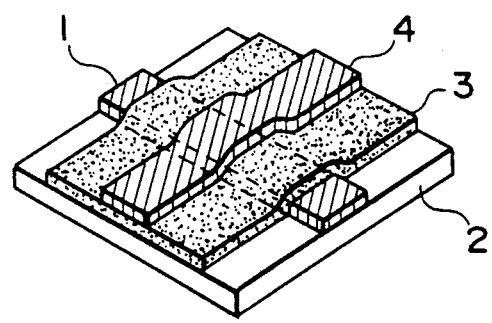
FIG. 2 is a schematic illustration of a photoconductive device of the present invention.

A device as shown in FIG. 2 was prepared. The polyamic acid solution used in Example 1 was applied by spin coating on a glass substrate 2 having a light-transmissive electrode (ITO 1 in stripe shape of 1 mm in width. The solvent was evaporated off. The coated film was heated at 300° C. for one hour to cause to be 0.5 μm. Further thereon, an aluminum electrode 4 of 1 mm in width was formed in the direction perpendicular to the light transmissive electrode in a thickness of 100 nm by a resistance-heating method (refer to FIG. 2).

For measurement of the photoelectric characteristics of the complete device, insolation was provided and the photovoltaic effect and the photoelectric current were observed. After heat treatment of the device further at 300° C. for one hour, measurement of the photoelectric characteristics gave the same values as those before the heat treatment, showing superior heat stability.

EXAMPLE 10

A polyamic acid film built up from 78 monomolecular layers was formed on a glass substrate having a light-transmissive electrode (ITO) in stripe shape of 1 mm in width and treated for hydrophobicity with a silane-coupling agent. The build-up film was heated at 300° C. for one hour to cause imidation and to form a photoconductive thin film. The film thickness was 48 nm.

The polyamic acid built-up film was formed according to the procedure below.

The polyamic acid solution used in Example 1 was diluted with dimethylacetamide (DMAC) to a concentration of $1 \times 10^{-3}$ mol/l in terms of the monomer concentration. Thereto N,N-dimethylhexadecylamine was mixed at a ratio of two relative to one equivalent of the repeating unit of polyamic acid to prepare a solution of a salt of polyamic acid-N,N-dimethylaminohexadecylamine. This solution was spread over pure water at temperature of 20° C. to form a monomolecular film on the water surface. The surface pressure was raised to 25 mN/m. With the surface pressure kept constant, the aforementioned glass substrate having the electrode was dipped and lifted in a direction of crossing the water surface at a rate of 5 mm/min. By repeating this operation, a build-up film was prepared from 78 monomolecular layers.

On this substrate, an aluminum electrode of 1 mm in width was formed in the direction perpendicular to the light transmissive electrode in a thickness of 100 nm by a resistance-heating method.

For measurement of the photoelectric characteristics of the completed device, insolation was provided and the photovoltaic effect and the photoelectric current were observed at nearly the same level as those of polyvinylcarbazole. After heat treatment or the device at 300° C. for one hour, the measurement of the photoelectric characteristics gave the same values as those before the heat treatment, showing superior heat stability.

EXAMPLES 11 TO 16

The polymides employed were derived by polymerizing diaminocarbazole with the organic compound shown in the column labelled "acid anhydride" in Table 2, and were formed into a thin film on a silicon substrate by the method shown in Table 2. Heat treatment was conducted by heating at 300° C. for one hour. The test specimens for measurement of the photoconductive properties were provided with an upper electrode of Al (100 nm) and a lower electrode of ITO (500 nm).

The results are shown in Table 2. The resulting polyimide had a high decomposition temperature and deterioration of the photoconductive properties was not observed by further heat treatment at 300° C. for one hour.

TABLE 2

| Example | Acid anhydride (upper electrode/lower electrode) | Thin film formation method and film thickness | Decomposition temperature of polymer | Deterioration of photoconductivity after heat treatment |
| --- | --- | --- | --- | --- |
| 11 | Biphenyltetracarboxylic anhydride 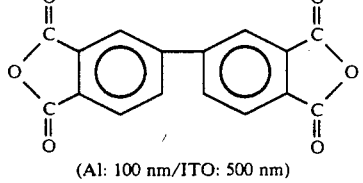 (Al: 100 nm/ITO: 500 nm) | LB method ca. 50 nm | 420° C. | No deterioration |
| 12 | Biphenyltetracarboxylic anhydride 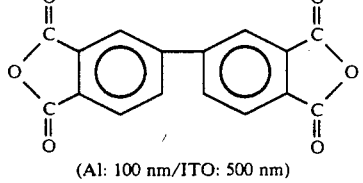 (Al: 100 nm/ITO: 500 nm) | Spin coating 0.7 μm | 420° C. | No deterioration |
| 13 | Benzophenonetetracarboxylic anhydride 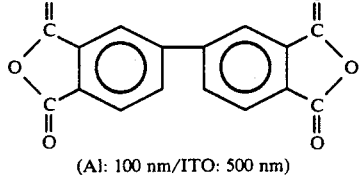 (Al: 100 nm/ITO: 500 nm) | LB method ca. 50 nm | 380° C. | No deterioration |

TABLE 2-continued

| Example | Acid anhydride (upper electrode/lower electrode) | Thin film formation method and film thickness | Decomposition temperature of polymer | Deterioration of photoconductivity after heat treatment |
|---|---|---|---|---|
| 14 | Benzophenonetetracarboxylic anhydride 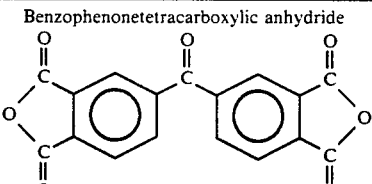 (Al: 100 nm/ITO: 500 nm) | Spin coating 0.5 μm | 380° C. | No deterioration |
| 15 | Cyclopentanetetracarboxylic anhydride 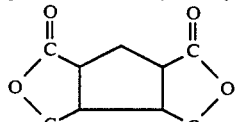 (Al: 100 nm/ITO: 500 nm) | LB method ca. 50 nm | 340° C. | No deterioration |
| 16 | Cyclopentanetetracarboxylic anhydride 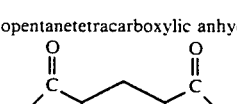 (Al: 100 nm/ITO: 500 nm) | Spin coating 0.4 μm | 340° C. | No deterioration |

COMPARATIVE EXAMPLE

A solution of polyvinylcarbazole was applied by spin coating on a glass substrate having a light-transmissive electrode (ITO) in stripe shape of 1 mm in width and having been treated for hydrophobicity with a silane coupling agent. The solvent was evaporated off by heating in an oven at 150° C. for one hour. The thickness of the film was approximately 1 μm. Further thereon, an aluminum electrode of 1 mm in width was formed in the direction perpendicular to the light transmissive electrode in a thickness of 100 nm by a resistance-heating method.

For measurement of the photoelectric characteristics of the completed device, insolation was provided and the photovoltaic effect and the photoelectric current were observed. The device was further treated by heating at 300° C. for one hour. By this treatment, the insolation properties were lost, and measurement of the photoelectric characteristics could not be conducted.

As described above, the photoconductive polyimide compound of the present invention is superior in photoconductivity and heat resistance as well as workability, and enables production of photoelectro-transducing devices employing an organic material which was difficult until now. The polyimide compound is prepared by a simple operation. Hence the present invention is very useful practically. Furthermore, the photoconductive device comprising the above compound of the present invention enables production of a photoelectro-transducing device extremely superior in heat resistance by using an organic material which has not been readily achievable until now, and the device can be formed in a simple manner. Therefore, the present invention is significantly useful from a practical point of view.

What is claimed is:

1. A photoconductive device comprising an organic film comprising a polymer having a carbazole skeleton and an imide linkage in a repeating unit thereof wherein the organic film is held between a pair of electrodes.

2. The photoconductive device of claim 1, wherein the repeating unit is represented by the general formula

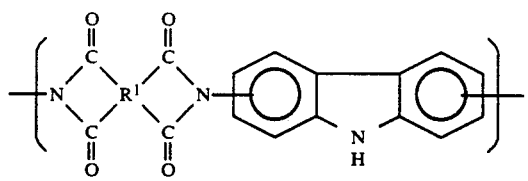

where $R^1$ denotes a tetravalent organic group having 5 to 13 carbons.

3. The photoconductive device of claim 2, wherein $R^1$ in the general formula is a tetravalent cyclic hydrocarbon group having 5 to 13 carbons.

4. The photoconductive device of claim 3, wherein the group $R^1$ is any one of the groups of

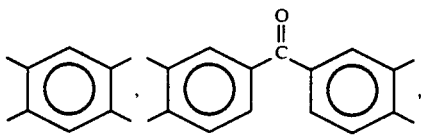

-continued

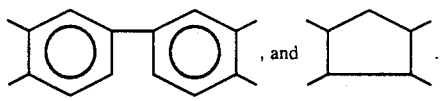

5. The photoconductive device of claim 1, wherein the organic film is built-up from a plurality of monomolecular layers of the polymer.

6. The photoconductive device of claim 1, wherein the decomposition temperature of the polymer is not lower than 300° C.

7. The photoconductive device of claim 1, wherein at least one electrode of said pair of electrodes is light-transmissive.

8. The photoconductive device of claim 1, wherein one of said pair of electrodes is a transparent electrode.

* * * * *